United States Patent
Kim

(10) Patent No.: US 9,171,846 B2
(45) Date of Patent: Oct. 27, 2015

(54) LEAKAGE AND PERFORMANCE GRADED MEMORY

(76) Inventor: Moon J. Kim, Wappingers Falls, NY (US)

(*) Notice: Subject to any disclaimer, the term of this patent is extended or adjusted under 35 U.S.C. 154(b) by 172 days.

(21) Appl. No.: 13/484,394

(22) Filed: May 31, 2012

(65) Prior Publication Data

US 2013/0322147 A1 Dec. 5, 2013

(51) Int. Cl.
G11C 5/06 (2006.01)
H01L 27/105 (2006.01)
G11C 5/02 (2006.01)
G11C 11/4097 (2006.01)
G11C 7/18 (2006.01)

(52) U.S. Cl.
CPC ............ *H01L 27/1052* (2013.01); *G11C 5/025* (2013.01); *G11C 5/063* (2013.01); *G11C 7/18* (2013.01); *G11C 11/4097* (2013.01); *Y10T 29/49002* (2015.01)

(58) Field of Classification Search
CPC ...... G11C 5/063; G11C 7/18; G11C 11/4097; G11C 5/025; G11C 5/04; G11C 5/147; G11C 5/14; G11C 11/4074; G11C 16/30; G11C 5/143; G11C 11/06085; G11C 1/0314; G11C 17/02; G11C 19/04; G11C 19/0841; G11C 11/5607; G11C 11/14; G11C 8/12; G11C 7/1006; G11C 7/10; H01F 1/0304; G06K 7/083
USPC .................. 365/63, 226, 132, 133, 230.03
See application file for complete search history.

(56) References Cited

U.S. PATENT DOCUMENTS

| | | |
|---|---|---|
| 6,219,627 B1 | 4/2001 | Bonneau et al. |
| 6,917,544 B2 | 7/2005 | Maayan et al. |
| 7,136,958 B2 | 11/2006 | Jeddeloh |
| 7,286,441 B1 | 10/2007 | White et al. |
| 7,380,085 B2 | 5/2008 | Matter et al. |
| 7,386,649 B2 | 6/2008 | Jeddeloh |
| 7,424,579 B2 | 9/2008 | Wheeler et al. |
| 7,461,191 B2 | 12/2008 | Baer et al. |
| 7,480,201 B2 | 1/2009 | Bartley et al. |
| 7,489,562 B2 | 2/2009 | Maayan et al. |
| 7,495,966 B2 | 2/2009 | Aritome |
| 7,573,745 B2 | 8/2009 | Maayan et al. |
| 7,581,055 B2 | 8/2009 | Jeddeloh |
| 7,663,635 B2 | 2/2010 | Rogers et al. |

(Continued)

OTHER PUBLICATIONS

Goodman, J., "Using Cache Memory to Reduce Processor-Memory Traffic", Department of Computer Sciences, University of Wisconsin-Madison, Madison, WI, (C) 1983, AMC 0149-7111/83/0600/0124801.00, 8 pages.

(Continued)

*Primary Examiner* — Fernando Hidalgo
(74) *Attorney, Agent, or Firm* — Hunter E. Webb; Keohane & D'Alessandro, PLLC

(57) ABSTRACT

Embodiments of the present invention provide a memory configuration on a chip containing multiple memory segments having different memory grades. In a typical embodiment, a single chip will be provided on which the memory segments are positioned. A memory grade may include low performance (low leakage), medium performance (medium leakage), and high performance (high leakage). Each memory segment or group of memory segments may have a separate power supply and/or controller. In one example, memory segments may be stacked in a through-silicon via configuration.

20 Claims, 18 Drawing Sheets

(56) References Cited

U.S. PATENT DOCUMENTS

| | | |
|---|---|---|
| 7,673,093 B2 | 3/2010 | Bartley et al. |
| 7,706,208 B2 | 4/2010 | Takemura et al. |
| 7,715,255 B2 | 5/2010 | Tu et al. |
| 7,738,304 B2 | 6/2010 | Maayan et al. |
| 7,772,880 B2 | 8/2010 | Solomon |
| 7,873,775 B2 | 1/2011 | Jeddeloh |
| 7,913,000 B2 | 3/2011 | Chung |
| 8,042,082 B2 | 10/2011 | Solomon |
| 8,054,663 B2 | 11/2011 | Chung |
| 2003/0161196 A1 | 8/2003 | Park et al. |
| 2009/0216960 A1 | 8/2009 | Allison et al. |
| 2011/0145609 A1* | 6/2011 | Berard et al. ................ 713/320 |
| 2012/0004011 A1 | 1/2012 | Chun |
| 2012/0092927 A1 | 4/2012 | Hara |
| 2013/0159630 A1* | 6/2013 | Lichmanov .................. 711/133 |

OTHER PUBLICATIONS

Mandal, A. et al., "Modeling Memory Concurrency for Multi-Socket Multi-Core Systems", Renaissance Computing Institute, Chapel Hill, NC, {anirban,rjt,akp}@renci.org, 978-1-4244-6022-9/10/$26 (C)2010 IEEEE, pp. 66-75.

Akesson, B. et al., "Memory Controllers for High-Performance and Real-Time MPSoCs, Requirements, Architectures, and Furture Trends", CODES+ISSS'11, Oct. 9-14, 2011, Taipei, Taiwan, (C) 2011, ACM 978-1-4503-0715-4/11/10 . . . $10, 10 Pages.

* cited by examiner

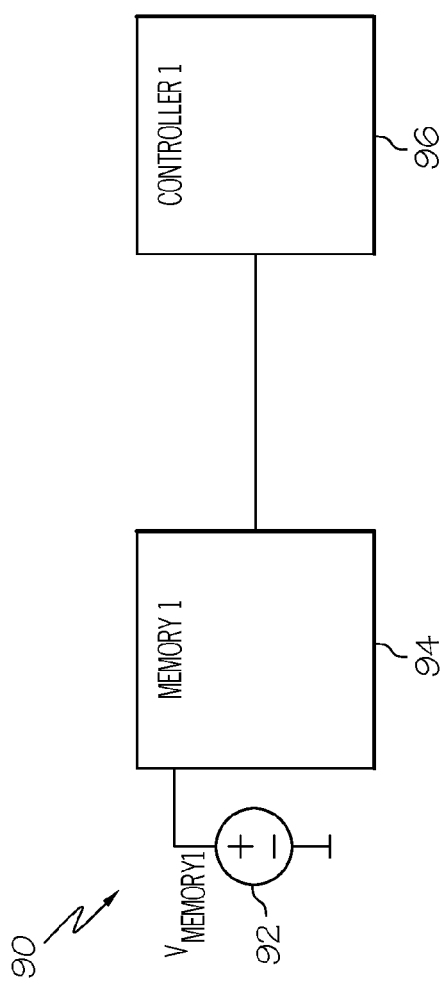

LEAKAGE AND PERFORMANCE GRADED MEMORY

FIELD OF THE INVENTION

In general, embodiments of the present invention provide a memory and storage system. Specifically, embodiments of the present invention provide a memory and storage system having multiple memory segments with multiple memory grades.

BACKGROUND OF THE INVENTION

Current mobile systems suffer from power leakage and consumption of semiconductor circuits. Moreover, current low-power circuits are based on conventional design schemes. However, mobile multi-core processor (MCP) implementations require a fundamentally different design approach for cores and on-chip memories. Still yet, current memory approaches are based on standard-based fixed speed having a fixed power supply. In some implementations, a sleep mode may be present. However, the sleep mode may take an extensive period of time for the memory to transition between sleep and wake modes.

U.S. Pat. No. 8,054,663 discloses a multi-memory chip memory configuration that utilizes a reference signal during use to measure process variation between memory segments and to compensate for the variation.

U.S. Pat. No. 7,873,775 discloses a multiple processor and memory segment device that utilizes a first primary set of memory segments and a secondary set of memory devices that are accessible through a memory segment of the primary set.

U.S. Pat. No. 7,772,880 discloses an intelligent multiple memory SoC design that is reconfigurable to process multiple application problems.

U.S. Pat. No. 7,715,255 discloses a multi-memory segment chip that utilizes the disablement or reprogramming of particular memory die after packaging.

U.S. Pat. No. 7,495,966 discloses a method for adjusting the "cycle voltage" of a memory block based upon the frequency of process cycles for that memory block.

U.S. Pat. No. 8,042,082 discloses a multi-memory segment stacked SOC device.

U.S. Pat. No. 7,913,000 discloses a multi-memory segment electronic device that utilizes a buffer for read operations.

U.S. Pat. No. 7,738,304 discloses a method for creating memory arrays with a mix of volatile and non-volatile memory segments.

U.S. Patent Application No. 2003/0161196 discloses a multi-component memory system that is mounted on a PCB with each memory segment having a branch point on the system bus.

U.S. Patent Application No. 2012/0004011 discloses a method for using both non-volatile and volatile memory in a mobile electronic device.

Unfortunately, none of these approaches addresses the deficiencies in the related art.

SUMMARY OF THE INVENTION

Embodiments of the present invention provide a memory configuration on a chip containing multiple memory segments having different memory grades. In a typical embodiment, a single chip will be provided on which the memory segments are positioned. A memory grade may include low performance (low leakage), medium performance (medium leakage), and high performance (high leakage). Each memory segment or group of memory segments may have a separate power supply and/or controller. In one example, memory segments may be stacked in a through-silicon via configuration.

A first aspect of the present invention provides memory architecture comprising: a memory component, wherein the memory component comprises one of a chip, a die, or a module, and the memory component further comprises a first memory segment having a first memory grade and a second memory segment having a second memory grade, wherein the first memory grade is different than the second memory grade.

A second aspect of the present invention provides memory architecture, comprising: a memory component, wherein the memory component comprises a first memory segment having a first memory grade and a second memory segment having a second memory grade; a first power supply, wherein the first power supply supplies a first voltage to the first memory segment; and a second power supply, wherein the second power supply supplies a second voltage to the second memory segment.

A third aspect of the present invention provides a method for forming a memory architecture comprising: coupling a first memory controller and a second memory controller coupled to a central processing unit (CPU); and coupling a memory device to the first memory controller and the second memory controller, wherein the memory device comprises a first memory segment having a first memory grade and a second memory segment having a second memory grade, wherein the first memory grade is different than the second memory grade, and wherein the memory device comprises one of a chip, a die, or a module.

BRIEF DESCRIPTION OF THE DRAWINGS

These and other features of this invention will be more readily understood from the following detailed description of the various aspects of the invention taken in conjunction with the accompanying drawings in which:

FIG. 9A depicts an example chip configuration having adjustable speed and power according to an embodiment of the present invention.

FIG. 9B depicts an example table representing a voltage control plan for speed and power targets according to an embodiment of the present invention.

Figure 1A:
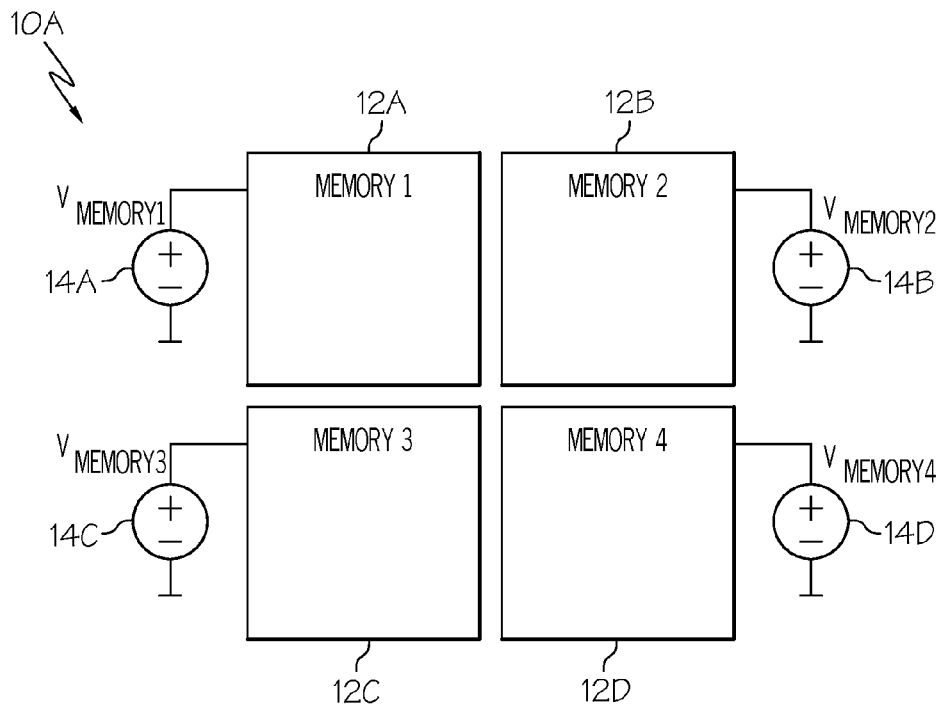
FIGS. 1A-B depict a diagram of an example single chip having a plurality of memory segments according to an embodiment of the present invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Illustrative embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third, etc. may be used herein to describe various buffers, cores, grades and/or memories, these buffers, cores, grades, and/or memories should not be limited by these terms. These terms are only used to distinguish one buffer, core, grade, or memory from another buffer, core, grade, or memory. Thus, a first buffer, core, grade, or memory discussed below could be termed a second buffer, core, grade, or memory without departing from the teachings of the present inventive concept.

Embodiments are described herein with reference to cross-sectional or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an edge or corner region illustrated as having sharp edges may have somewhat rounded or curved features. Likewise, elements illustrated as circular or spherical may be oval in shape or may have certain straight or flattened portions. Thus, the regions illustrated in the figures are schematic in nature and their shapes are not intended to illustrate the actual shape of a region or element of a device and are not intended to limit the scope of the disclosed embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention provide a memory configuration on a chip containing multiple memory segments having different memory grades. In a typical embodiment, a single chip will be provided on which the memory segments are positioned. A memory grade may include low performance (low leakage), medium performance (medium leakage), and high performance (high leakage). Each memory segment or group of memory segments may have a separate power supply and/or controller. In one example, memory segments may be stacked in a through-silicon via configuration.

Referring now to FIG. 1A, a diagram of an example single chip 10A having a plurality of memory segments according to an embodiment of the present invention is depicted. As depicted, chip 10A comprises memory_1 12A, memory_2 12B, memory_3 12C, memory_4 12D, voltage for memory_1 ($V_{MEMORY1}$) 14A, voltage for memory_2 ($V_{MEMORY2}$) 14B, voltage for memory_3 ($V_{MEMORY3}$) 14C and voltage for memory_4 ($V_{MEMORY4}$) 14D. Multiple on-chip or in-package memory segments may be configured on a single chip. Each memory segment may be graded by its performance. Performance of each memory segment may be measured post-manufacturing.

Figure 1B:
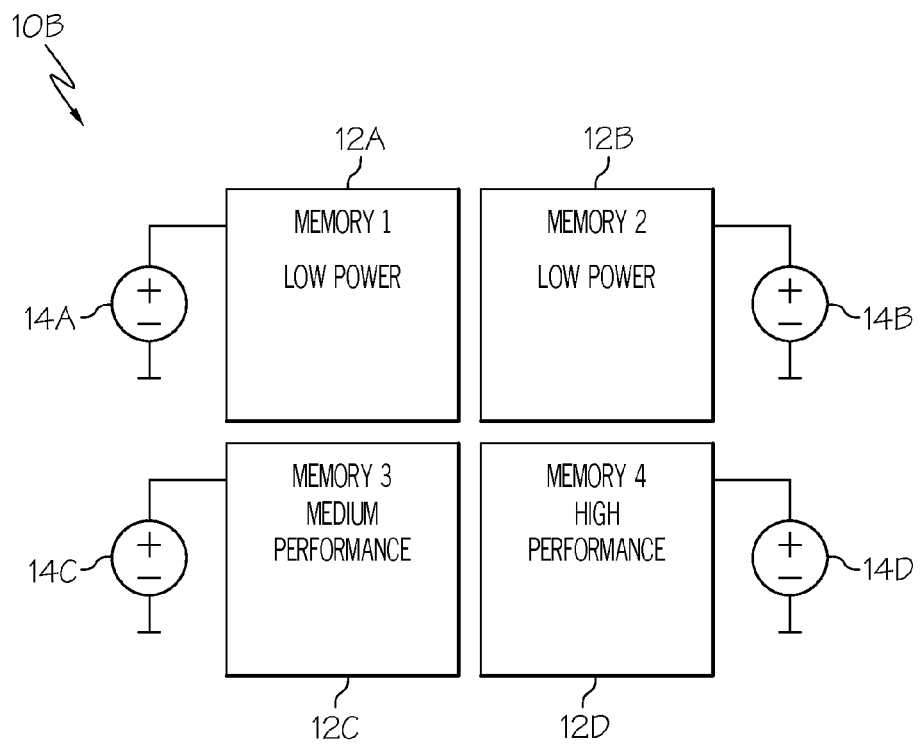

FIG. 1B depicts a diagram of another example single chip 10B having a plurality of memory segments according to an embodiment of the present invention is depicted. As depicted, chip 10B comprises memory_1 12A, memory_2 12B, memory_3 12C, memory_4 12D, voltage for memory_1 ($V_{MEMORY1}$) 14A, voltage for memory_2 ($V_{MEMORY2}$) 14B, voltage for memory_3 ($V_{MEMORY3}$) 14C and voltage for memory_4 ($V_{MEMORY4}$) 14D. Each memory segment may be manipulated to achieve a certain design goal. Different segments may receive different semiconductor doping to adjust leakage and performance. As shown in FIG. 1B, memory_1 12A and memory_2 12B are manipulated for low power, memory_3 12C is manipulated for medium performance and memory_4 12D is manipulated for high performance. Memory segments may be re-graded after semiconductor processing to reflect manufacturing process variations. Each memory segment or group of memory segments may have its own power supply and/or controller. In one example, memory segments may be stacked in a through-silicon via configuration. A TSV is a vertical electrical connection passing completely through a silicon wafer or die.

Figure 2A:
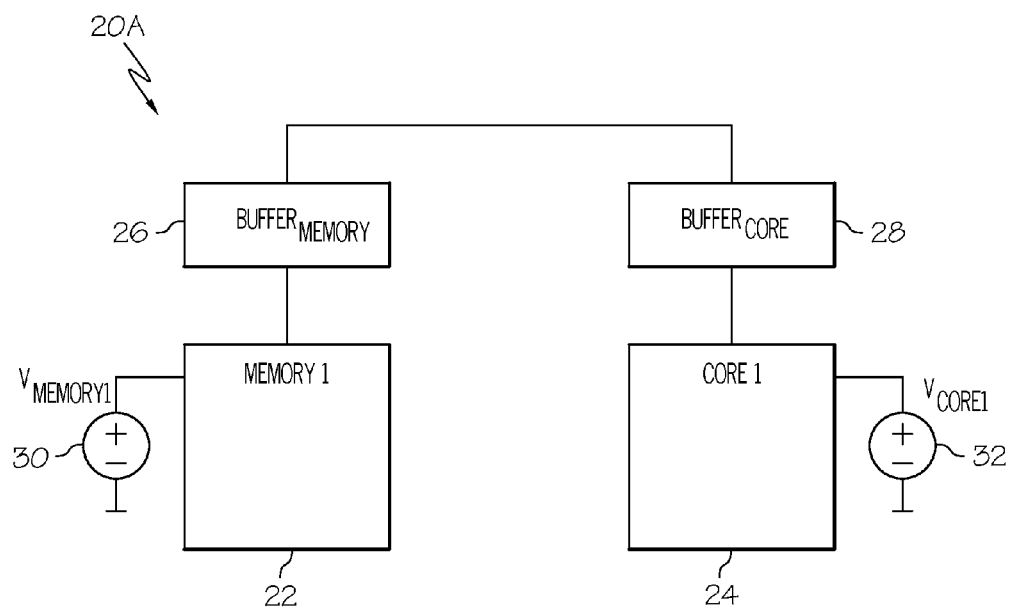
FIGS. 2A-B depict a diagram of an example leakage and performance graded memory architecture according to an embodiment of the present invention.

FIG. 2A depicts a diagram of an example leakage and performance graded memory chip 20A according to an embodiment of the present invention. As depicted, a chip 20A includes buffer for memory (BUFFER$_{MEMORY}$) 26, memory_1 22, voltage for memory_1 (V$_{MEMORY1}$) 30, buffer for core (BUFFER$_{CORE}$) 28, core_1 24 and voltage for core_1 (V$_{CORE1}$) 32. In one example, core_1 24 and memory_1 22 have independent voltage supplies for power and performance optimization. The buffers (BUFFER$_{MEMORY}$ 26 and BUFFER$_{CORE}$ 28) are used to translate different voltage levels.

Figure 2B:
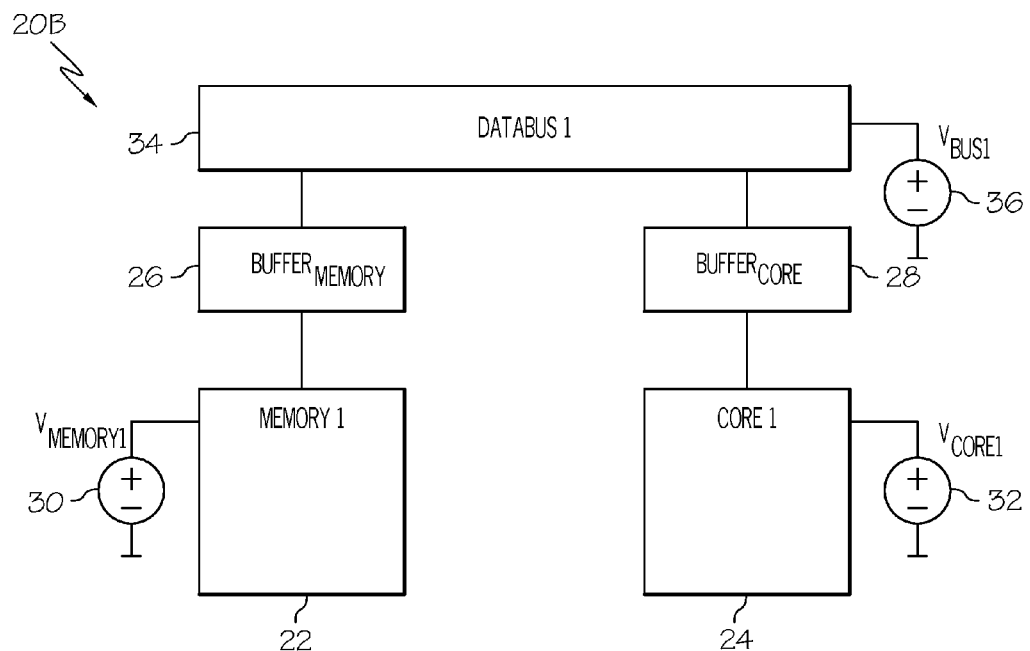

FIG. 2B depict diagram of an example leakage and performance graded memory chip 20B according to an embodiment of the present invention. As depicted, a chip 20B includes buffer for memory (BUFFER$_{MEMORY}$) 26, memory_1 22, voltage for memory_1 (V$_{MEMORY1}$) 30, buffer for core (BUFFER$_{CORE}$) 28, core_1 24, voltage for core_1 (V$_{CORE1}$) 32, databus_1 34 and voltage for databus_1 (V$_{BUS1}$) 36. In one example, databus_1 34 may have an independent power supply and controller for bus data rate control. In another example, each databus (such as databus_1 34) may be graded by performance. The voltage level of databus_1 34 may be adjusted to achieve a designated throughput.

FIGS. 3A-D depict a view of an example chip configuration 37A-D having memory segments and a core according to an embodiment of the present invention. As shown, chips 37A-D each may comprise memory_1 38A, memory_2 38B, memory_3 38C, memory_4 38D and core_1 39. Overall chip performance is defined by the different grading of the memory segments. For example, a grade 3 may represent highest performance, while grade 1 may represent the least leakage. Non-participating memory segments may be powered down. Memory segments that are powered down in FIGS. 3A-D are shown as shaded.

Figure 3A:
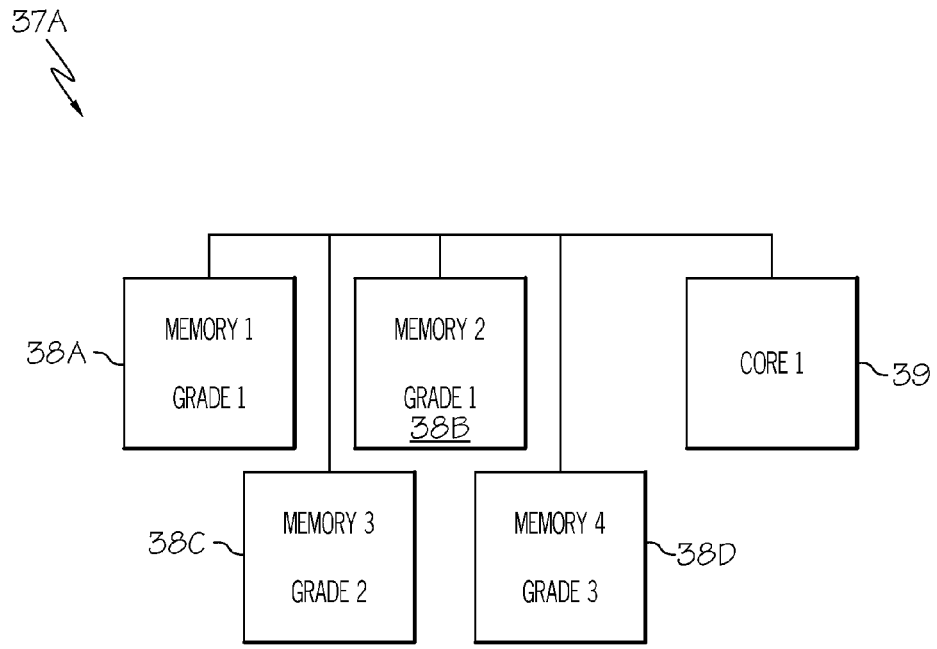
FIGS. 3A-D depict a view of an example chip configuration having memory segments and a core according to an embodiment of the present invention.
Figure 3B:
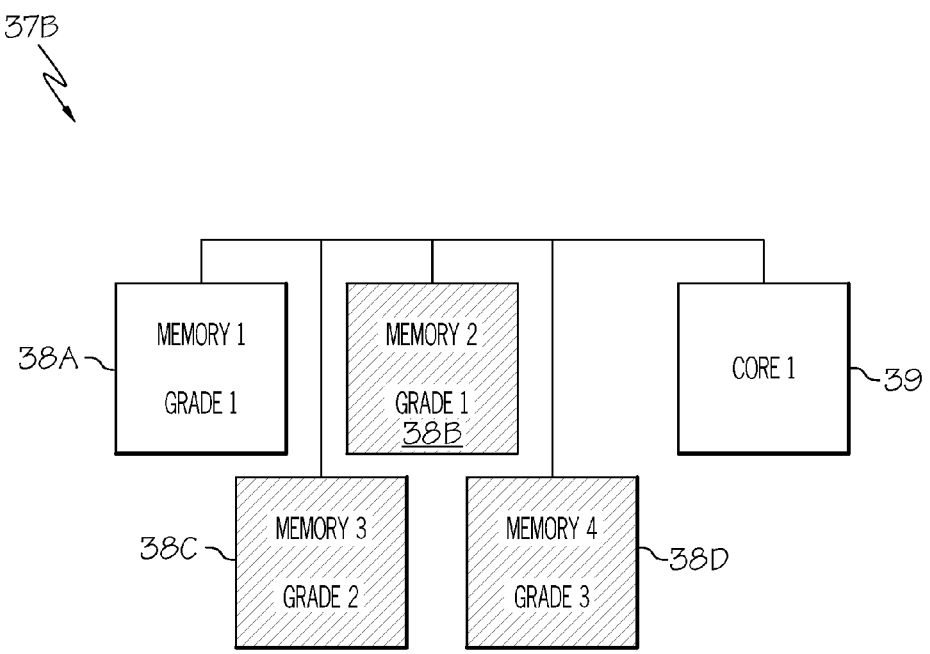
Figure 3C:
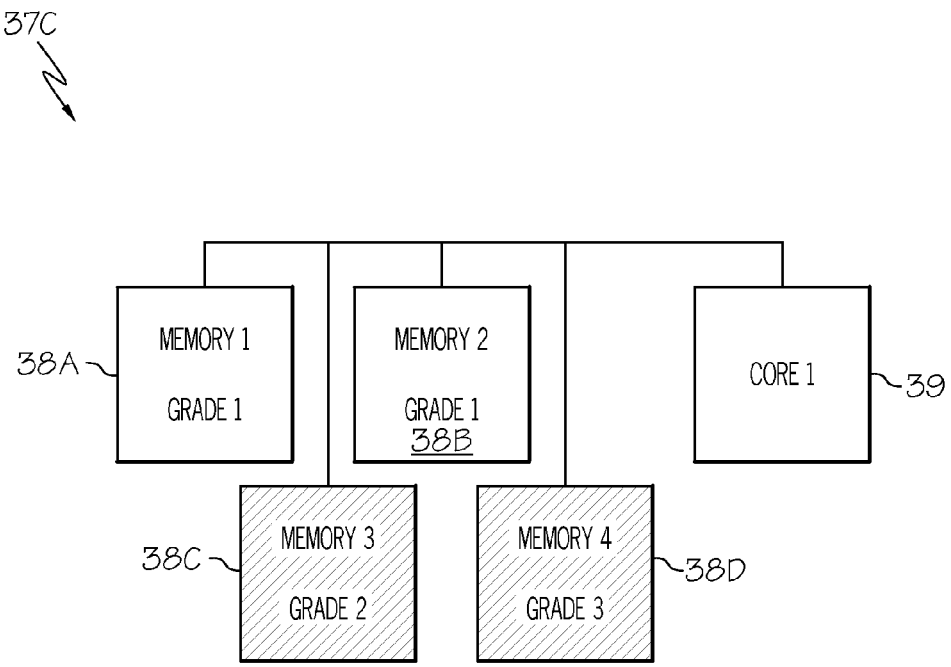
Figure 3D:
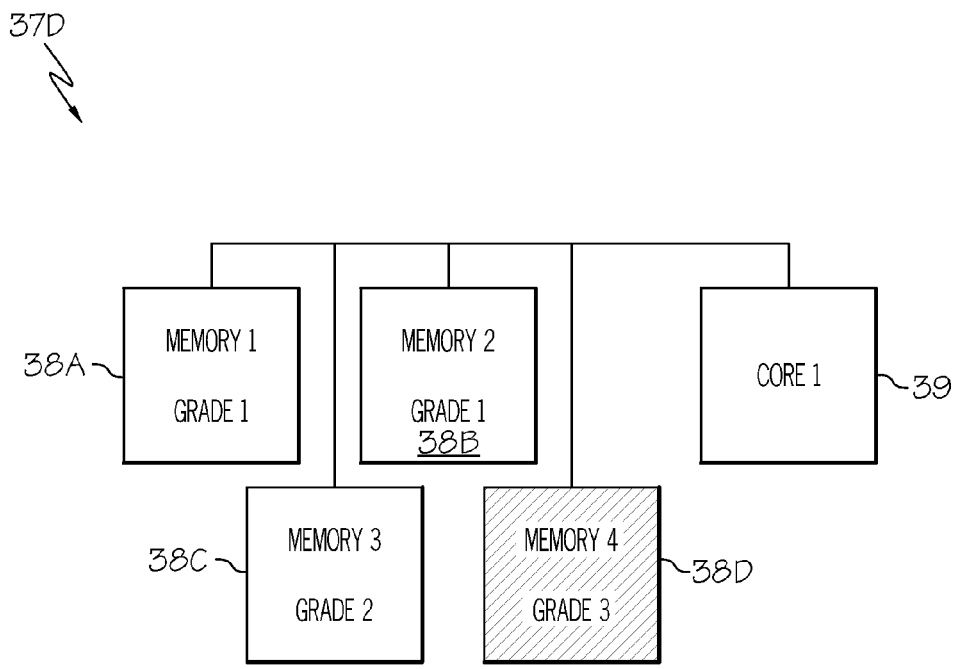

In FIG. 3A, all memory segments are utilized for maximum performance. In FIG. 3B, only memory_1 38A with grade 1 participates for minimal power and performance. The shading of the other memory segments (memory_2 38B, memory_3 38C and memory_4 38D) indicates that those memory segments are powered down. In FIG. 3C, memory_1 38A and memory_2 38B (each with grade 1) participate for more power and performance than FIG. 3B. Memory_3 38C and memory_4 38D are powered down. In FIG. 3D, only memory_4 38D with grade 3 is powered down. Memory_1 38A with grade 1, memory_2 38B with grade 1 and memory_3 38C with grade 2 participate for more power and performance than FIG. 3C.

FIGS. 4A-D depicts a view of an example chip configuration 40A-D each having memory segments and cores according to an embodiment of the present invention. As shown, chips 40A-D each may comprise memory_1 42A, memory_2 42B, memory_3 42C, memory_4 42D, core_1 44A and core_2 44B. Each memory segment and core may be graded differently and utilized to achieve overall chip performance. Cores and memory segments may selectively participate. Non-participating cores and/or memory segments may be powered down. Cores and memory segments that are powered down are shown as shaded in FIGS. 4A-D.

Figure 4A:
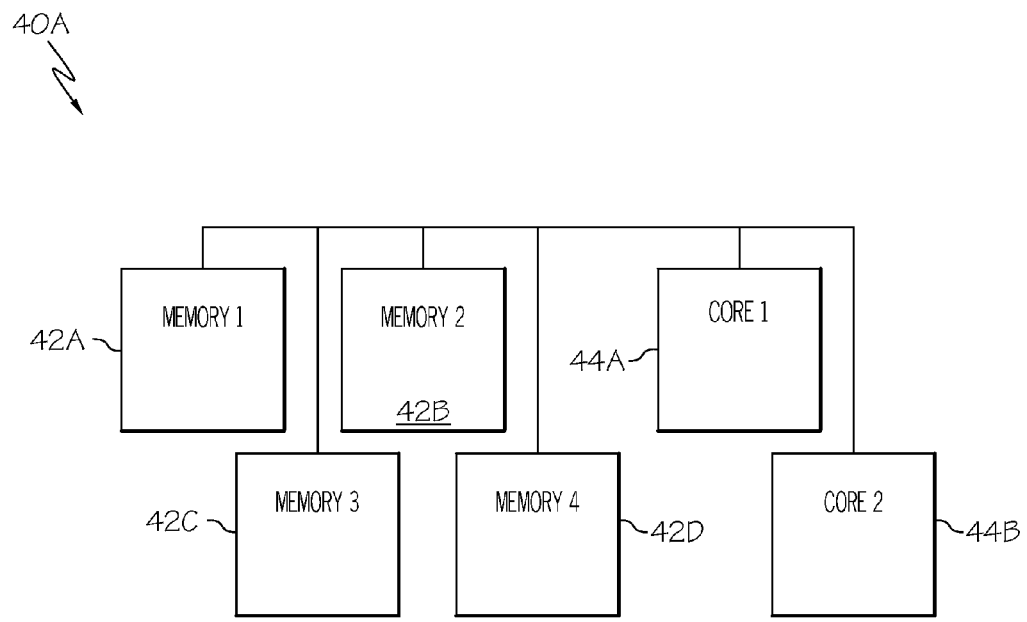
FIGS. 4A-D depict a view of an example chip configuration having memory segments and cores according to an embodiment of the present invention.
Figure 4B:
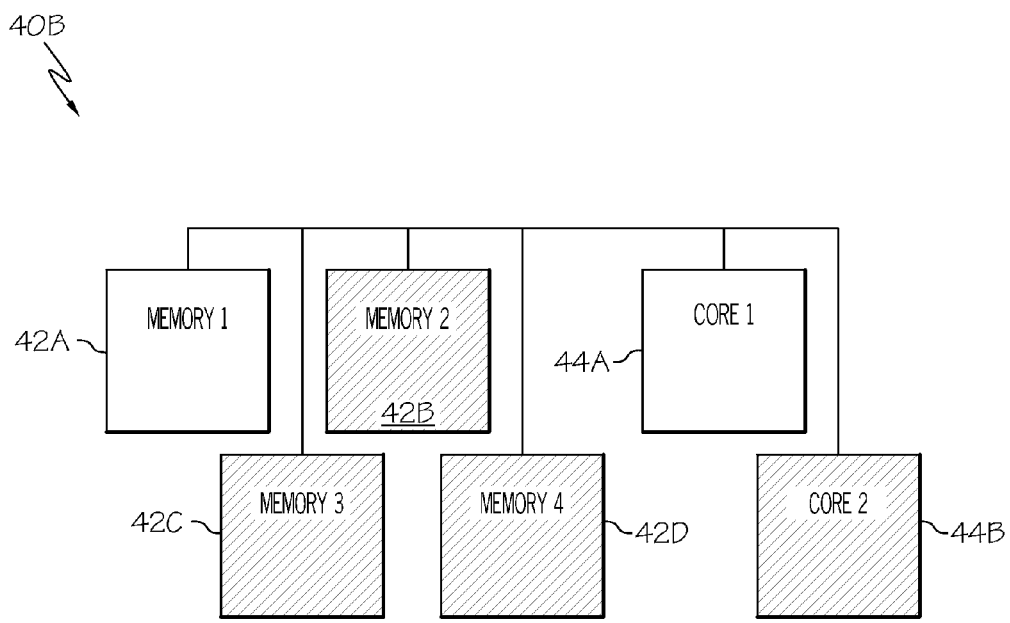
Figure 4C:
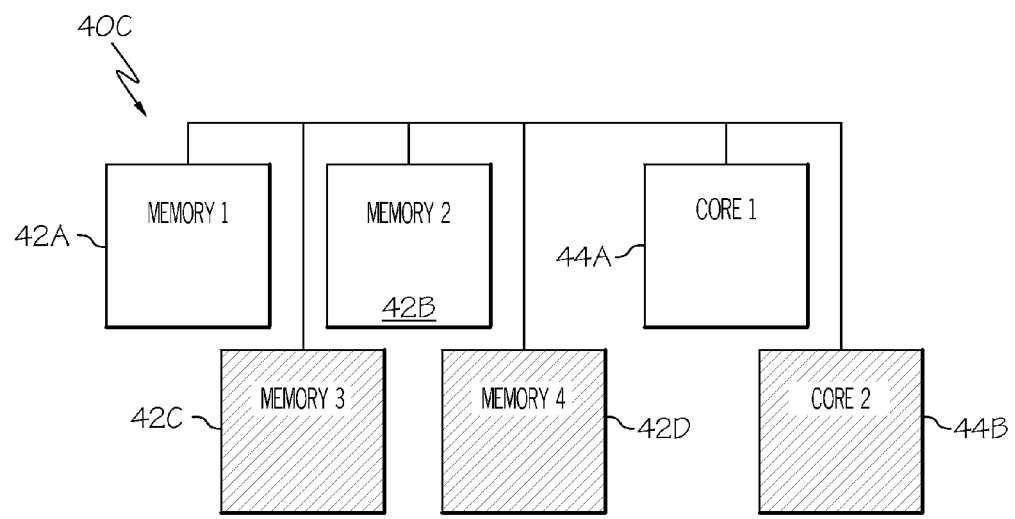
Figure 4D:
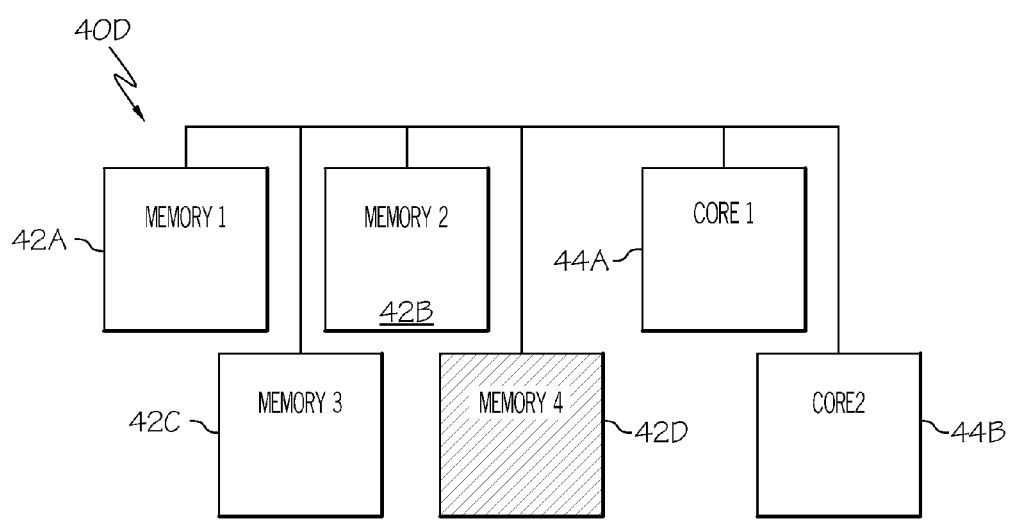

In FIG. 4A, all memory segments and cores are utilized for maximum performance. In FIG. 4B, only memory_1 42A and core_1 44A participate for minimal power and performance. The shading of the other memory segments (memory_2 42B, memory_3 42C, memory_4 42D and core_2 44B) indicates that those memory segments are powered down. In FIG. 4C, memory_1 42A, memory_2 42B and core_1 44A participate for more power and performance than FIG. 4B. Memory_3 42C, memory_4 42D and core_2 44B are powered down. In FIG. 4D, only memory_4 42D is powered down. Memory_1 42A, memory_2 42B, memory_3 42C, core_1 44A and core_2 44B participate for more power and performance than FIG. 4C.

FIGS. 5A-D depict a view of an example chip configuration 50A-D having memory segments selectively mapped to cores according to an embodiment of the present invention. As shown, chips 50A-D each may comprise memory_1 52A, memory_2 52B, memory_3 52C, memory_4 52D, core_1 54A and core_2 54B. Memory segments may be selectively mapped to cores and tuned for performance. Cores and memory segments that are powered down are shown as shaded in FIGS. 5A-D.

Figure 5A:
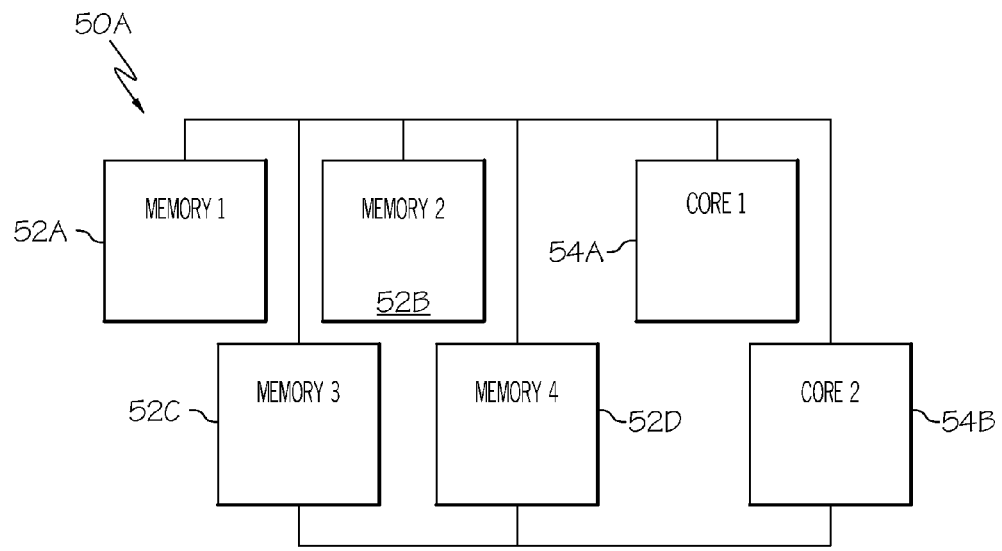
FIGS. 5A-D depict a view of an example chip configuration having memory segments selectively mapped to cores according to an embodiment of the present invention.
Figure 5B:
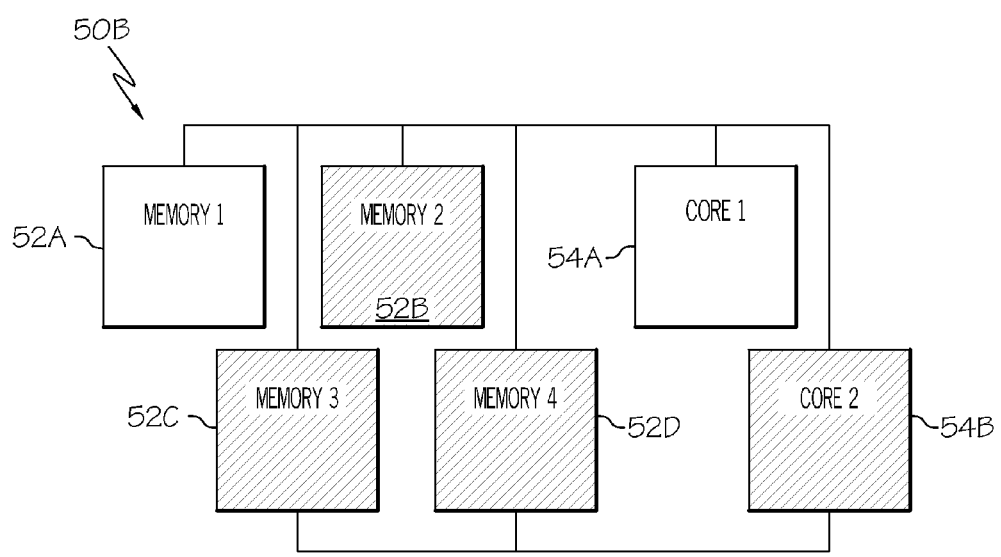
Figure 5C:
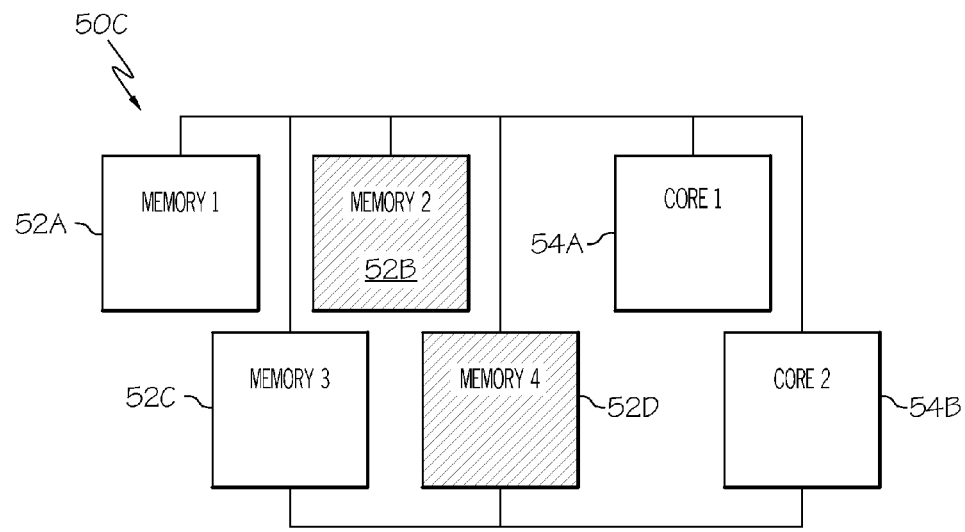
Figure 5D:
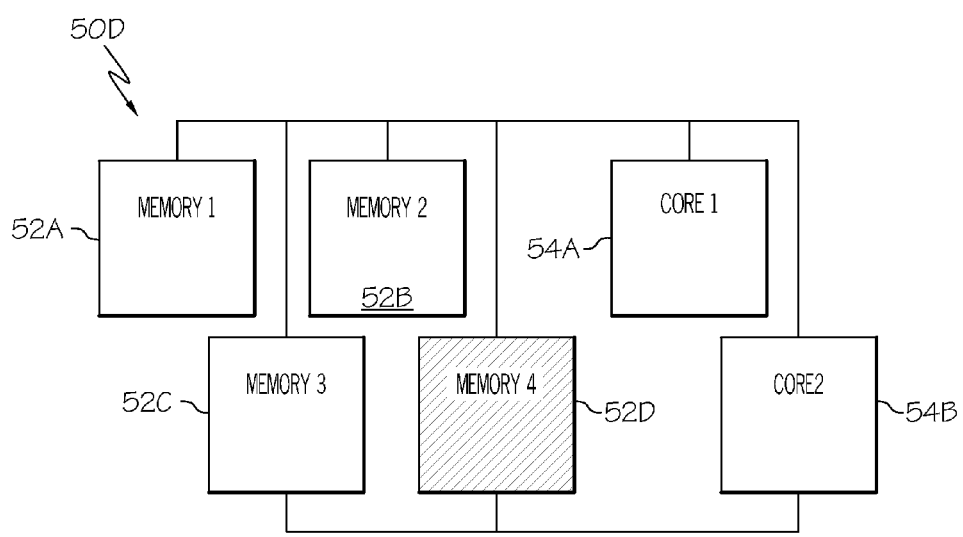

In FIG. 5A, all memory segments and cores are utilized and shared for maximum performance. In FIG. 5B, only memory_1 52A and core_1 54A participate for minimal power and performance. In FIG. 5C, the pairs (memory_1 52A/core_1 54A and memory_3 52C/core_2 54B) work together for more power and performance than FIG. 5B. Memory_2 52B and memory_4 52D are powered down. In FIG. 5D, only memory_4 52D is powered down. Core_1 54A works with memory_1 52A and memory_2 52B, while core_2 54B works with memory_3 54C only to provide power and performance.

FIGS. 6A-D depict a view of an example chip configuration 60A-D having memory segments and cores selectively activated and mapped according to an embodiment of the present invention. As shown, chips 60A-D each may comprise memory_1 62A, memory_2 62B, memory_3 62C, memory_4 62D, core_1 64A and core_2 64B. Memory segments and cores may be selectively activated and mapped to achieve a power and performance target. Cores and memory segments that are powered down are shown as shaded in FIGS. 6A-D.

Figure 6A:
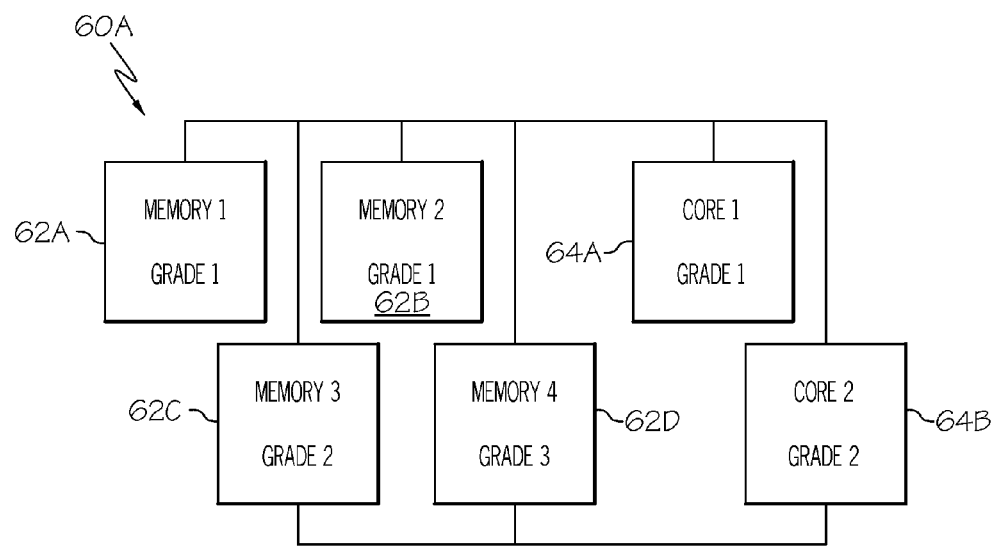
FIGS. 6A-D depict a view of an example chip configuration having memory segments and cores selectively activated and mapped according to an embodiment of the present invention.
Figure 6B:
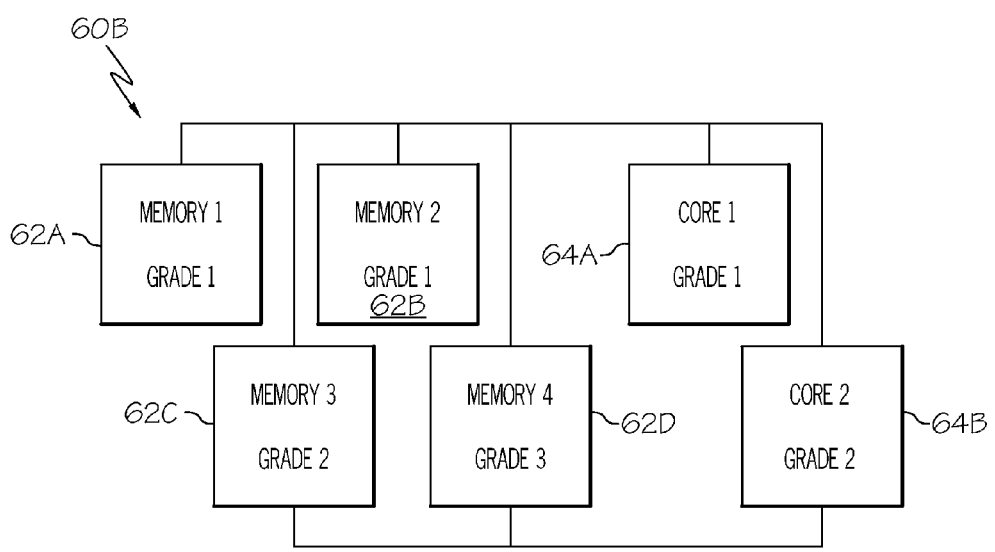
Figure 6C:
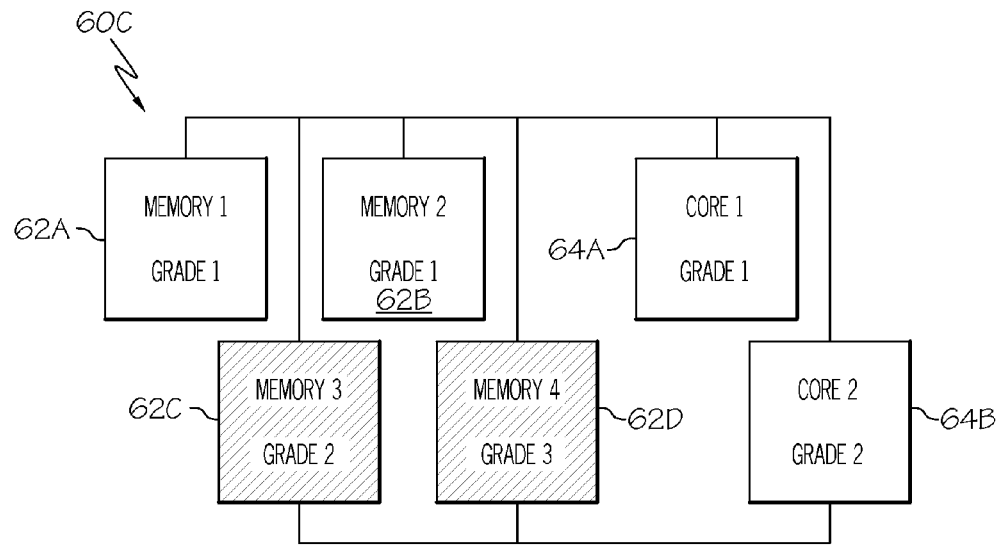
Figure 6D:
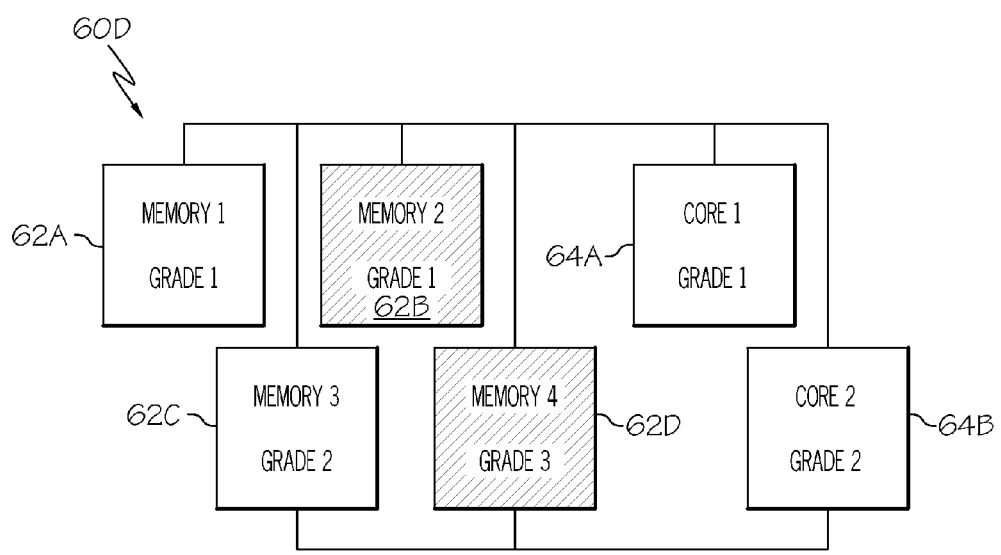

In FIG. 6A, all memory segments and cores are utilized and shared for maximum performance. In FIG. 6B, core_1 64A is mapped to memory_1 62A and memory_2 62B which are graded low (grade 1). Core_2 64B uses higher grade memory segments (memory_3 62C at grade 2 and memory_4 62D at grade 3). In FIG. 6C, both cores (core_1 64S and core_2 64B) use grade 1 memory segments (memory_1 62A and memory_2 62B). In FIG. 6D, core_2 64B uses grade 2 memory_3 62C to increase its performance.

Figure 7A:
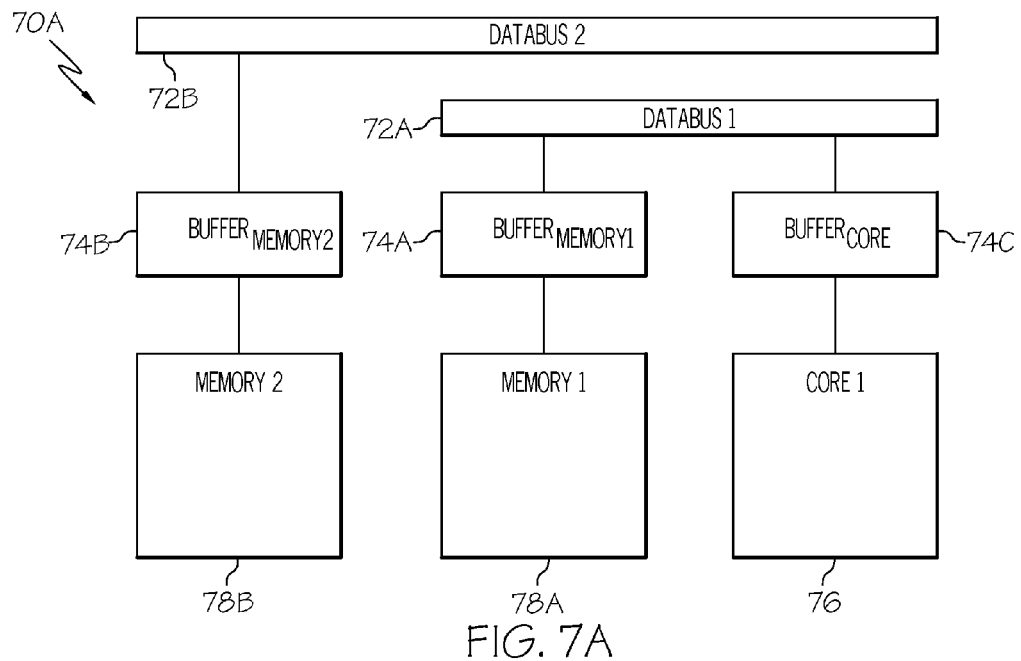
FIGS. 7A-B depict a diagram of example chip configuration utilizing a databus according to an embodiment of the present invention.
Figure 7B:
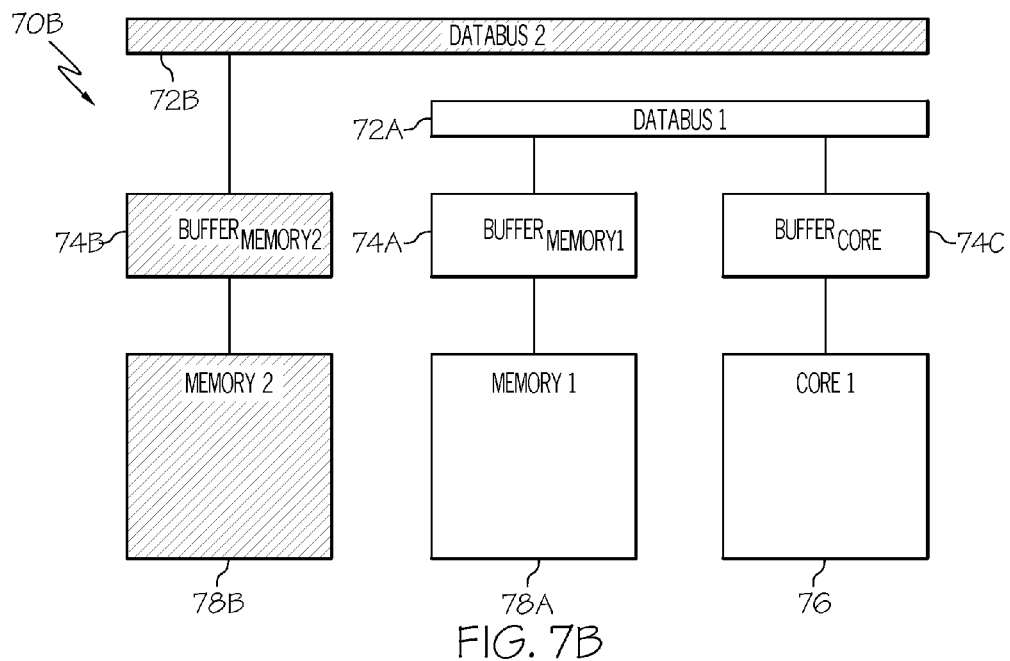

FIGS. 7A-B depict a diagram of example chip configuration 70A-B utilizing a databus according to an embodiment of the present invention. As shown, chips 70A-B each may comprise databuses 72A-B, buffers 74A-C, core 1 76 and memory segments 78A-B. Databuses may be selectively powered down to support memory and core operation and to achieve a power and performance target.

In FIG. 7A, both databuses (databus_1 72A and databus_2 72B) are utilized for memory_1 78A and memory_2 78B operation. In FIG. 7B, databus_2 72B, buffer for memory_2 (BUFFER$_{MEMORY2}$) 74B and memory_2 78B are powered down for lower power operation.

Figure 8:
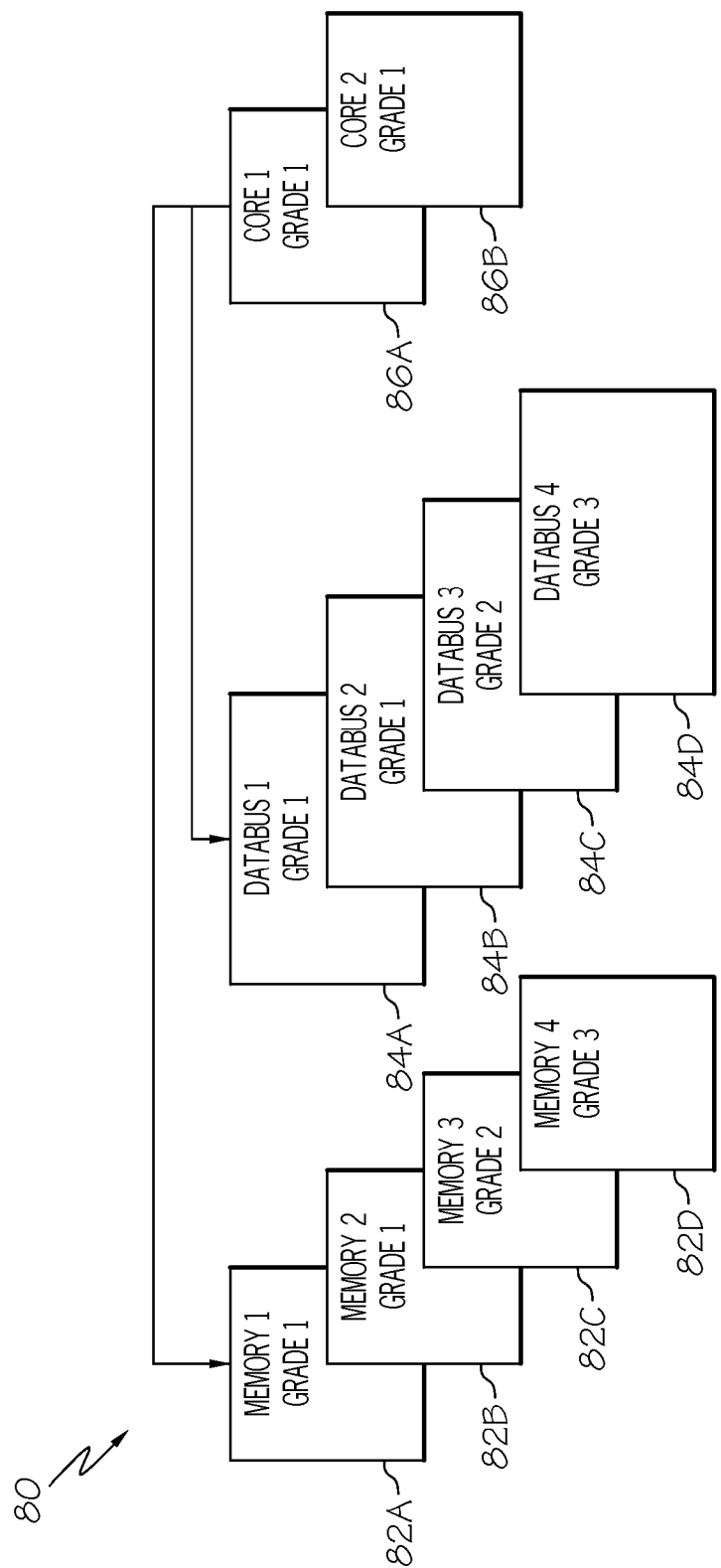
FIG. 8 depicts an example memory operation control diagram according to an embodiment of the present invention.

FIG. 8 depicts an example memory operation control diagram 80 according to an embodiment of the present invention. Memory segments 82A-D, databuses 84A-D and cores 86A-B are shown. As shown, the lowest power core (core_1 86A) provides control over memory segments and databuses through voltage supply switches and input/output (I/O) controls. In one example, an external controller may be utilized for core and memory configuration provisioning.

FIG. 9A depicts an example chip configuration 90 having adjustable speed and power according to an embodiment of the present invention. Voltage for memory_1 ($V_{MEMORY1}$) 92, memory_1 94 and controller_1 96 are shown. Memory blocks may be powered up by multiple levels of voltage supplies. Memory response time and data rate may be adjusted by changing the power supply.

Each memory may have multiple segments. Each segment or a group of segments may have its own independent voltage supply. Each segment or a group of segments may adjust its own response time and/or date rate by adjusting the voltage supply. Each segment or a group of segments may be differentially manufactured with a design intention. Each segment or a group of segments may be mapped to different speed modes. Low power segments are utilized for low power operation. High-performance segments are used for high performance. Segments or a group of segments in the chip may be shut down by direction of the external controller. In one example, addressing space may be flexibly adjusted to support ultra-low power operation within a few segments. Internal direct memory access (DMA) may be used to enable real-time mode switching.

FIG. 9B depicts an example table 98 representing a voltage control plan for speed and power targets according to an embodiment of the present invention. Memory is powered up by a dedicated voltage supply. External controller supplies control information through control registers (both standard and extended). Memory response time and data rate may be adjusted along with the power supply change. In one example, the memory power supply may be controlled by the memory itself. In another example, the memory power supply may be controlled by an external controller.

Figure 10A:
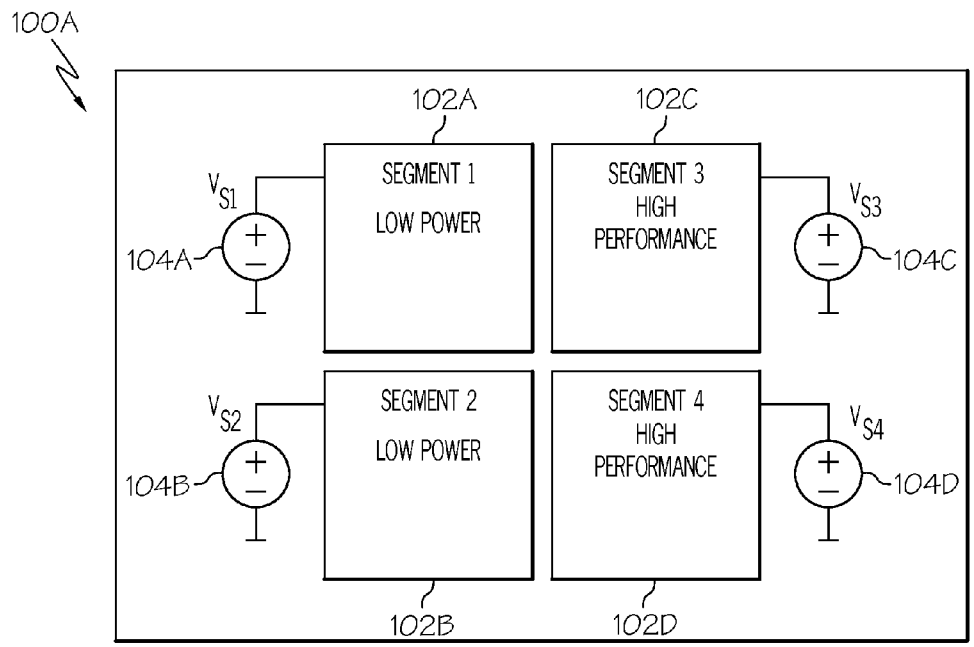
FIGS. 10A-B depict an example memory configuration for adjustable speed and power according to an embodiment of the present invention.
Figure 10B:
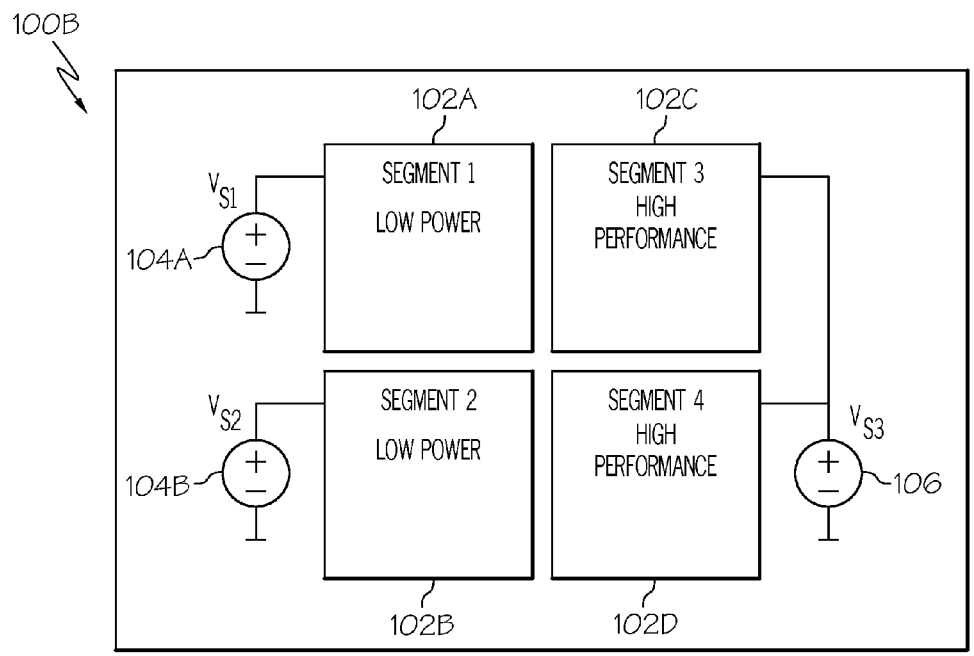

FIGS. 10A-B depict an example memory configuration 100A-B for adjustable speed and power according to an embodiment of the present invention. The memory configuration 100A-B may be a memory die, chip, or module. As shown, the memory configuration 100A-B has multiple segments with a separate or grouped power supply. Each memory configuration 100A-B comprises segment_1 102A, segment_2 102B, segment_3 102C, segment_4 102D, voltage for segment_1 ($V_{S1}$) 104A, voltage for segment_2 ($V_{S2}$) 104B, voltage for segment_3 ($V_{S3}$) 104C and voltage for segment_4 ($V_{S4}$) 104D.

Each segment or group of segments can be designed to have different power and speed characteristics.

Each segment or group of segments may have its own latency and data rate response. Segment access may be controlled by using its address space. An external controller may set the segment voltage supply to achieve a desired power and performance target. A segment responses a specific speed it can operate with the controller at the given voltage level. For example, if a segment's response is passive, then the controller has to read actively. The controller may set a predetermined latency and data rate per segment access. In some examples, a segment's speed may be adjusted in real-time by the controller. By adjusting power supply, the entire system can have homogeneous speed characteristics if necessary.

Figure 11A:
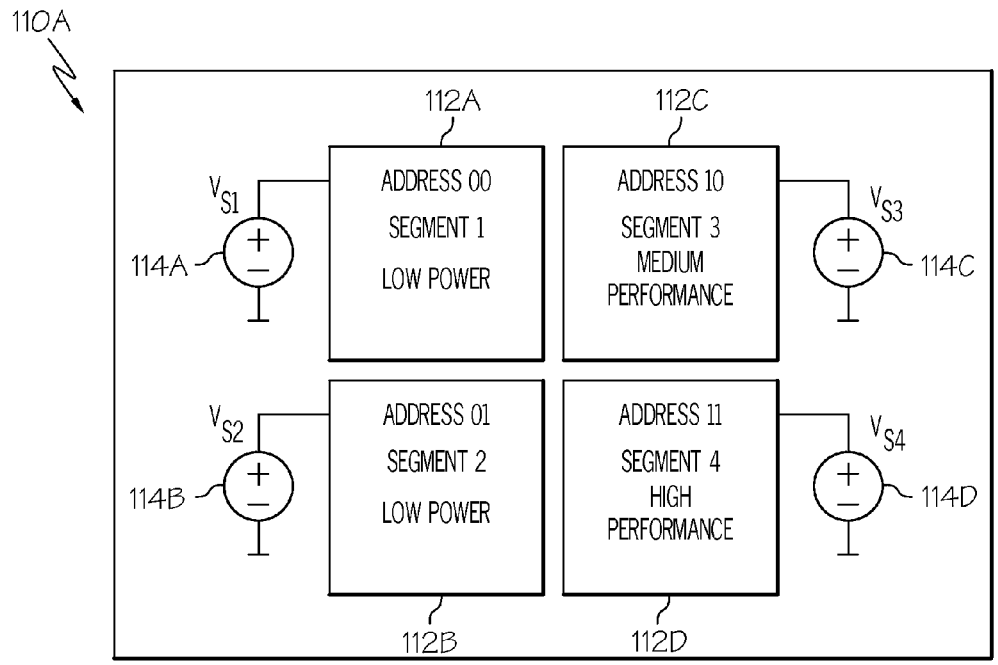
FIG. 11A depicts an example memory configuration in which an address space is used to access a memory segment according to an embodiment of the present invention.

FIG. 11A depicts an example memory configuration 110A in which an address space is used to access a memory segment according to an embodiment of the present invention. As shown, the memory configuration 110A has multiple segments with a separate or grouped power supply. Memory configuration 110A comprises segment_1 112A, segment_2 112B, segment_3 112C and segment_4 112D. FIG. 110A further comprises voltage for segment_1 ($V_{S1}$) 114A, voltage for segment_2 ($V_{S2}$) 114B, voltage for segment_3 $V_{S3}$) 114C and voltage for segment_4 ($V_{S4}$) 114D. Segment_1 112A has address 00 and is low power. Segment_2 112B has address 01 and is low power. Segment_3 112C has address 10 and is medium performance. Segment_4 112D has address 11 and is high performance.

Figure 11B:
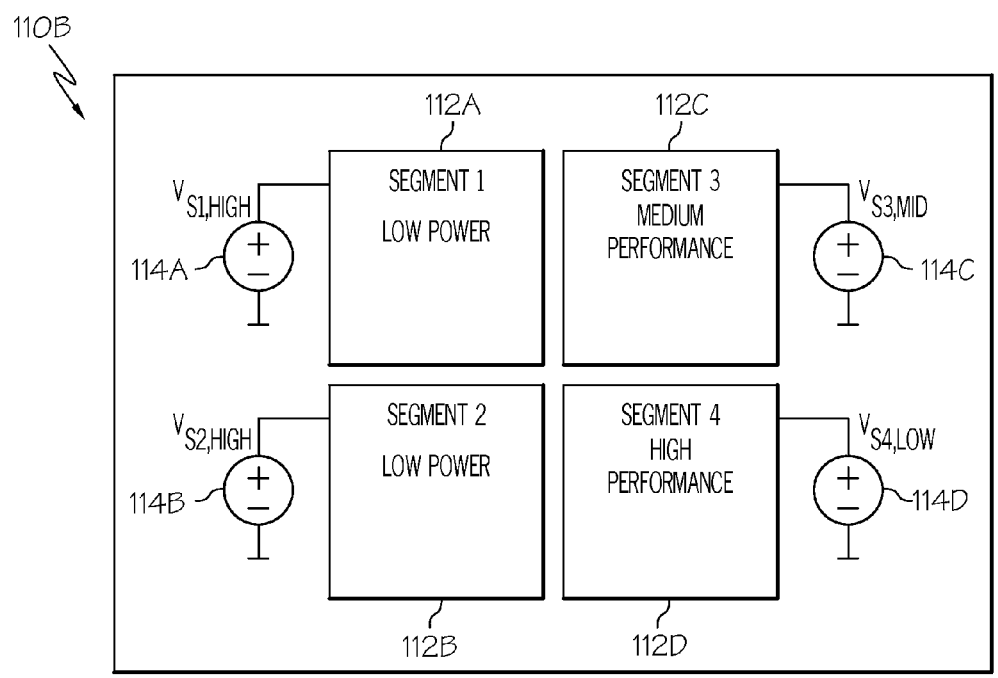
FIG. 11B depicts an example memory configuration in which power supply control is used to achieve homogeneous performance according to an embodiment of the present invention.

FIG. 11B depicts an example memory configuration 110B in which power's supply control is used to achieve homogeneous performance according to an embodiment of the present invention. As shown, the memory configuration 110B has multiple segments with a separate or grouped power supply. Memory configuration 110B comprises segment_1 112A, segment_2 112B, segment_3 112C and segment_4 112D. Segment_1 112A has address 00 and is low power. Segment_2 112B has address 01 and is low power. Segment_3 112C has address 10 and is medium performance. Segment_4 112D has address 11 and is high performance. FIG. 110B further comprises voltage for segment_1 ($V_{S1,HIGH}$) 114A, voltage for segment_2 ($V_{S2,HIGH}$) 114B, voltage for segment_3 ($V_{S3,MID}$) 114C and voltage for segment_4 ($V_{S4,LOW}$) 114D.

In FIG. 11B, segment_1 112A and segment_2 112B are low-power segments and are driven with relatively high voltage setup to have maximum performance. Segment_3 112C is driven with relatively medium voltage to maintain medium performance. Segment_4 112D is driven with relatively low voltage to keep track with other segments.

FIGS. 12A-D depict an example memory configuration 120A-D for adjustable memory space and throughput according to an embodiment of the present invention. As shown, the memory configuration 120A-D has multiple segments with a separate or grouped power supply. Each memory configuration 120A-D comprises segment_1 122A, segment_2 122B, segment_3 122C and segment_4 122D. Each segment or group of segments can be designed to have different memory space and throughput characteristics. As shown, segment_1 122A and segment_2 122B are low power. Segment_3 122C and segment_4 122D are high performance.

Figure 12A:
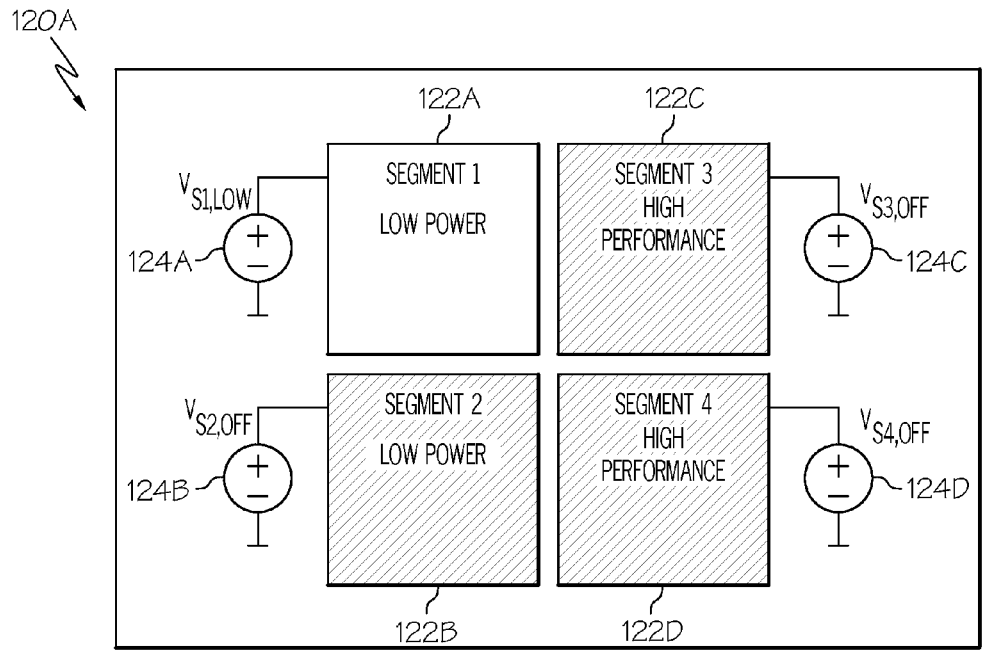
FIGS. 12A-D depict an example memory configuration for adjustable memory space and throughput according to an embodiment of the present invention.

FIG. 12A further comprises voltage for segment_1 ($V_{S1,LOW}$) 124A, voltage for segment_2 ($V_{S2,OFF}$) 124B, voltage for segment_3 ($V_{S3,OFF}$) 124C and voltage for segment_4 ($V_{S4,OFF}$) 124D. Memory configuration 120A is configured for minimal performance and power as only segment_1 122A is powered on.

Figure 12B:
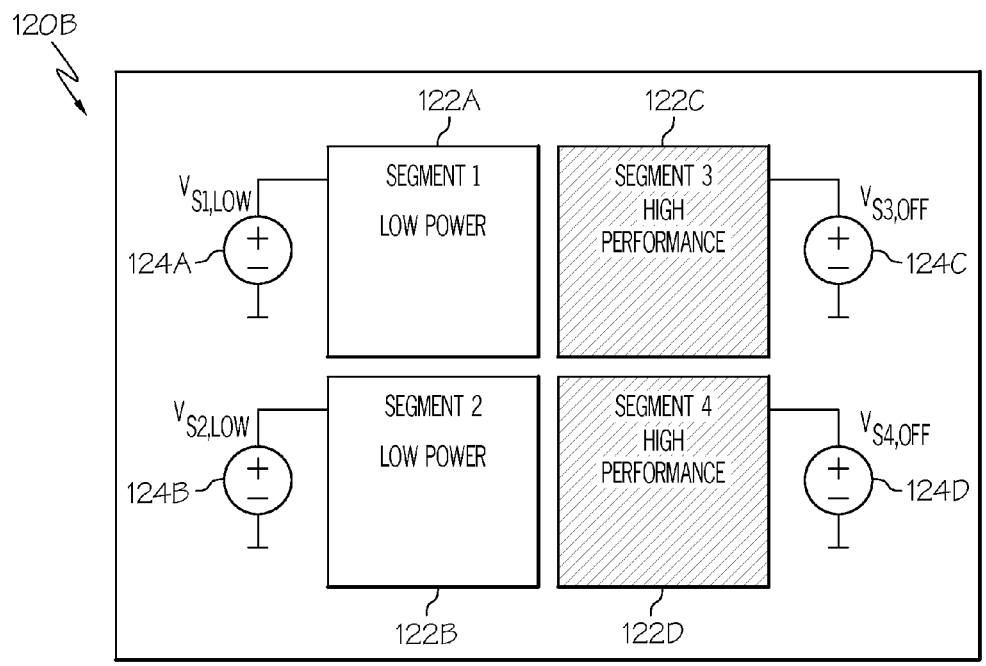

FIG. 12B further comprises voltage for segment_1 ($V_{S1,LOW}$) 124A, voltage for segment_2 ($V_{S2,LOW}$) 124B, voltage for segment_3 ($V_{S3,MID}$) 124C and voltage for segment_4 ($V_{S4,LOW}$) 124D. Memory configuration 120B is configured for more memory space with minimal power. Segment_1 122A and segment_2 122B are powered on with low power.

Figure 12C:
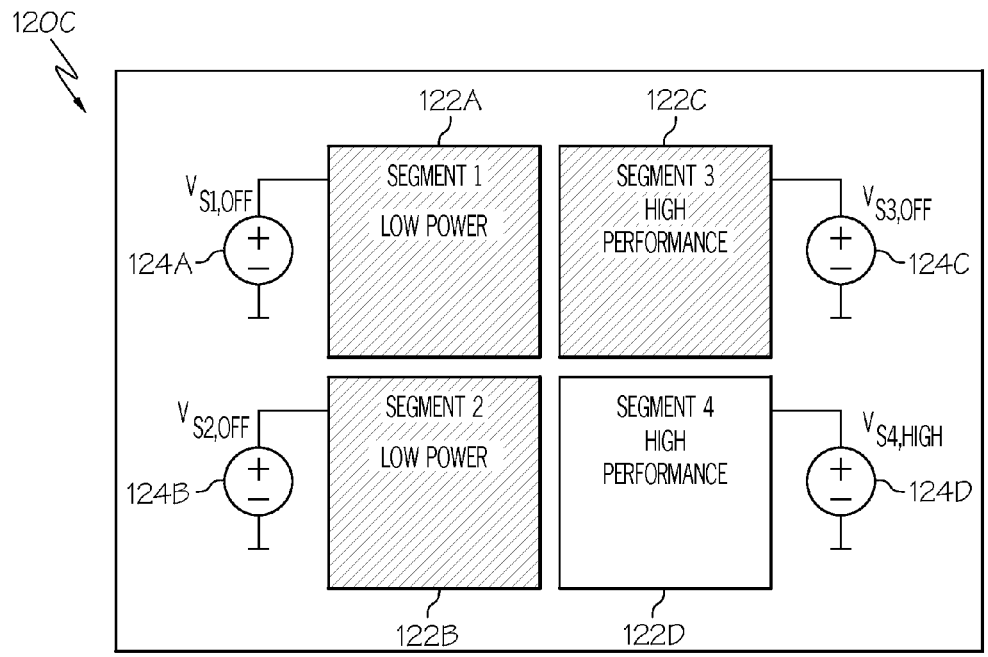

FIG. 12C further comprises voltage for segment_1 ($V_{S1,OFF}$) 124A, voltage for segment_2 ($V_{S2,OFF}$) 124B, voltage for segment_3 ($V_{S3,OFF}$) 124C and voltage for segment_4 ($V_{S4,HIGH}$) 124D. Memory configuration 120C is configured for small memory space with high throughput. Segment_4 122D is powered on with high performance.

Figure 12D:
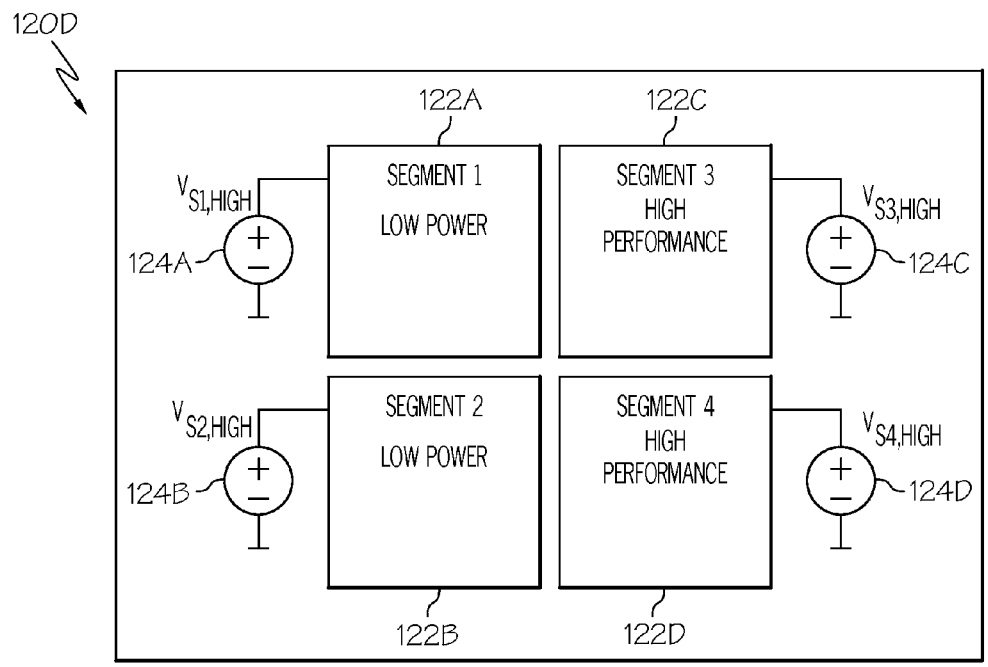

FIG. 12D further comprises voltage for segment_1 ($V_{S1,HIGH}$) 124A, voltage for segment_2 ($V_{S2,HIGH}$) 124B, voltage for segment_3 ($V_{S3,HIGH}$) 124C and voltage for segment_4 ($V_{S4,HIGH}$) 124D. Memory configuration 120D is configured for the most memory and throughput. All voltage sources are powered on with high voltage.

Figure 13:
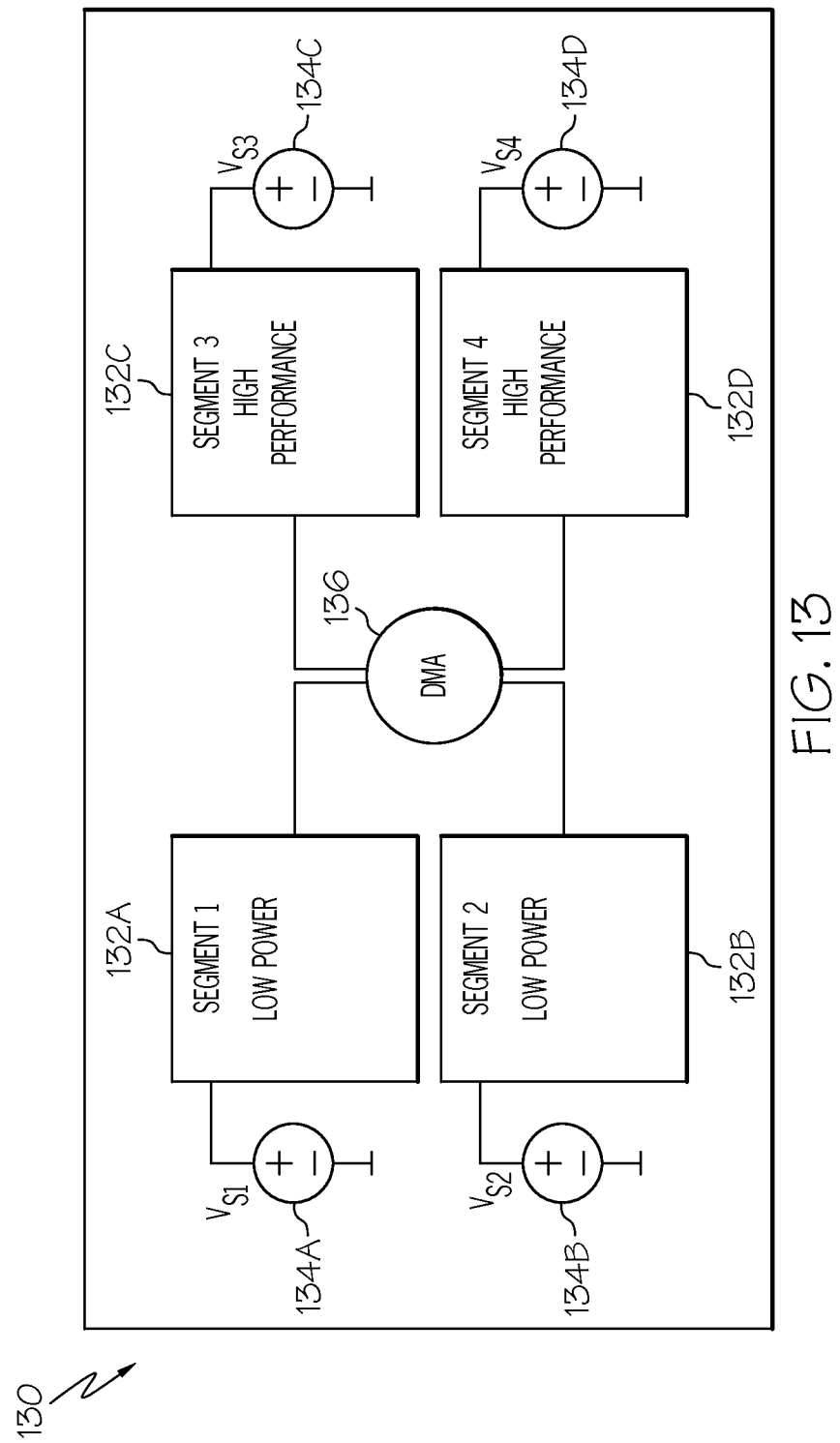
FIG. 13 depicts an example memory configuration with an internal direct memory access (DMA) according to an embodiment of the present invention.

FIG. 13 depicts an example memory configuration 130 with an internal direct memory access (DMA) according to an embodiment of the present invention. Memory configuration 130 comprises segment_1 132A, segment_2 132B, segment_3 132C, segment_4 132D, voltage for segment_1 ($V_{S1}$) 134A, voltage for segment_2 ($V_{S2}$) 134B, voltage for segment_3 ($V_{S3}$) 134C and voltage for segment_4 ($V_{S4}$) 134D.

Memory configuration 130 further comprises DMA 136 to expedite block to block, or segment to segment data transfer. DMA 136 enables rapid transitions between high-performance and low-power modes.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A memory architecture comprising:
    a memory component located on a single chip in a mobile computer device, wherein the memory component comprises one of the single chip, a die on the chip, and a module on the chip, and the memory component further comprises a first memory segment located on the single chip which is assigned a first memory grade, the first memory grade being a performance measure based on a re-grading of the first memory segment measured post-manufacturing that reflects manufacturing process variations in the first memory segment, and a second memory segment located on the single chip which is assigned a second memory grade, the second memory grade being a performance measure based on a re-grading of the second memory segment measured post-manufacturing that reflects manufacturing process variations in the second memory segment, wherein the first memory grade is different than the second memory grade; and
    an external controller that associates each memory segment with a respective memory grade based on the re-grading and selectively changes a mode of operation of the memory component by activating a set of memory segments having the first memory grade to achieve a first mode of operation and by activating a second set of memory segments having the second memory grade to achieve a second mode of operation,
    wherein the first memory segment and the second memory segment are stacked in a through-silicon via (TSV) configuration.

2. The memory architecture of claim 1, wherein the first memory grade is associated with one of a power or a performance of the first memory segment, and the second memory grade is associated with one of a power or a performance of the second memory segment.

3. The memory architecture of claim 2,
    wherein, in case that the first memory grade is associated with the power of the first memory segment, the power of the first memory segment is associated with the power supply received at the first memory segment, and
    wherein, in case that the first memory grade is associated with the performance of the first memory segment, the performance of the first memory segment is associated with the throughput of the first memory segment.

4. The memory architecture of claim 1, wherein the first memory segment is powered by a first power supply and the second memory segment is powered by a second power supply.

5. The memory architecture of claim 1, wherein the first memory segment is controlled by a first controller and the second memory segment is controlled by a second controller.

6. The memory architecture of claim 2, wherein, in case that the first memory grade is associated with the performance of the first memory segment, the performance of the first memory segment and the performance of the second memory segment are measured post-manufacturing.

7. A memory architecture, comprising:
    a memory component located on a single chip in a mobile computer device, wherein the memory component comprises a first memory segment located on the single chip which is assigned a first memory grade, the first memory grade being a performance measure based on a re-grading of the first memory segment measured post-manufacturing that reflects manufacturing process variations in the first memory segment, and a second memory segment located on the single chip which is assigned a second memory grade, the second memory grade being a performance measure based on a re-grading of the second memory segment measured post-manufacturing that reflects manufacturing process variations in the second memory segment;
    a first power supply, wherein the first power supply supplies a first voltage to the first memory segment;
    a second power supply, wherein the second power supply supplies a second voltage to the second memory segment; and
    an external controller that associates each memory segment with a respective memory grade based on the re-grading and selectively changes a mode of operation of the memory component by activating the first power supply for a set of memory segments having the first memory grade to achieve a first mode of operation and by activating the second power supply for a second set of memory segments having the second memory grade to achieve a second mode of operation,
    wherein the first memory segment and the second memory segment are stacked in a through-silicon via (TSV) configuration.

8. The memory architecture of claim 7, wherein the memory component comprises one of a chip, a die, or a module.

9. The memory architecture of claim 7, wherein the first memory grade is associated with one of the first voltage or a performance of the first memory segment and the second memory grade is associated with one of the second voltage or a performance of the second memory segment.

10. The memory architecture of claim 9,
    wherein, in case that the first memory grade is associated with the performance of the first memory segment, the performance of the first memory segment is associated with the throughput of the first memory segment and
    wherein, in case that the second memory grade is associated with the performance of the second memory segment, the performance of the second memory segment is associated with the throughput of the second memory segment.

11. The memory architecture of claim 8, wherein the first memory segment is controlled by a first controller and the second memory segment is controlled by a second controller.

12. The memory architecture of claim 9, wherein the performance of the first memory segment and the performance of the second memory segment are measured post-manufacturing.

13. The memory chip of claim 7, wherein the first memory segment and the second memory segment are stacked in a through-silicon via (TSV) configuration.

14. A method for forming a memory architecture comprising:
    coupling a fist memory controller and a second memory controller located on a single chip and coupled to a central processing unit (CPU) located on the single chip in a mobile computer device;

coupling a memory device located on the single chip to the first memory controller and the second memory controller, wherein the memory device comprises a first memory segment located on the single chip which is assigned a first memory grade, the first memory grade being a performance measure based on a re-grading of the first memory segment measured post-manufacturing that reflects manufacturing process variations in the first memory segment, and a second memory segment located on the single chip which is assigned a second memory grade, the second memory grade being a performance measure based on a re-grading of the second memory segment measured post-manufacturing that reflects manufacturing process variations in the second memory segment, and wherein the memory device comprises one of the single chip, a die on the chip, and a module on the chip; and coupling an external controller to the first memory controller and the second memory controller, the external controller associating each memory segment with a respective memory grade based on the re-grading and selectively changes a mode of operation of the memory component by activating the first memory controller for a set of memory segments having the first memory grade to achieve a first mode of operation and by activating the second memory controller for a second set of memory segments having the second memory grade to achieve a second mode of operation, wherein the first memory segment and the second memory segment are stacked in a through-silicon via (TSV) configuration.

15. The method of claim 14, wherein the first memory grade is associated with one of a power or a performance of the first memory segment, and the second memory grade is associated with one of a power or a performance of the second memory segment.

16. The method of claim 15, wherein, in case that the first memory grade is associated with the power of the first memory segment, the power of the first memory segment is associated with the power supply received at the first memory segment, and wherein, in case that the first memory grade is associated with the performance of the first memory segment, the performance of the first memory segment is associated with the throughput of the first memory segment.

17. The method of claim 14, further comprising:

coupling the first memory segment to a first power supply; and coupling the second memory segment to a second power supply.

18. The method of claim 14, further comprising controlling the first memory segment with the first memory controller and controlling the second memory segment with the second memory controller.

19. The method of claim 14, further comprising measuring the performance of the first memory segment and the performance of the second memory segment post-manufacturing.

20. The method of claim 14, further comprising stacking the first memory segment and the second memory segment in a through-silicon via (TSV) configuration.

* * * * *